United States Patent [19]
Nozawa et al.

[11] Patent Number: 5,255,153
[45] Date of Patent: Oct. 19, 1993

[54] ELECTROSTATIC CHUCK AND PLASMA APPARATUS EQUIPPED THEREWITH

[75] Inventors: Toshihisa Nozawa, Yokohama; Junichi Arami, Hachioji; Isahiro Hasegawa, Zushi; Katsuya Okumura, Yokohama, all of Japan

[73] Assignees: Tokyo Electron Limited, Tokyo; Kabushiki Kaisha Toshiba, Kawasaki, both of Japan

[21] Appl. No.: 731,478

[22] Filed: Jul. 17, 1991

[30] Foreign Application Priority Data
Jul. 20, 1990 [JP] Japan ................... 2-192462

[51] Int. Cl.⁵ ............................................... H02N 13/00
[52] U.S. Cl. ........................................ 361/234; 361/235
[58] Field of Search ............... 361/230, 233, 234, 235; 269/8, 903; 279/128

[56] References Cited

U.S. PATENT DOCUMENTS

| | | | |
|---|---|---|---|
| 4,384,918 | 5/1983 | Abe | 361/234 |
| 4,645,218 | 2/1987 | Ooshio et al. | 361/234 |
| 4,667,110 | 5/1987 | Kariya | 361/234 |
| 5,151,845 | 9/1992 | Watanabe et al. | 361/234 |

Primary Examiner—Jeffrey A. Gaffin
Attorney, Agent, or Firm—Oblon, Spivak, McClelland, Maier & Neustadt

[57] ABSTRACT

An electrostatic chuck having an electrostatic holding member arranged on an upper surface of the chuck main body for holding a semiconductor device during a plasma etching process. The electrostatic holding member includes a pair of insulating polyimide members and a conductive member interposed between the polyimide members. In operation, a voltage is applied to the first conductive member in order to generate static electricity to be applied to the electrostatic holding member for holding the semiconductor device.

16 Claims, 4 Drawing Sheets

ELECTROSTATIC CHUCK AND PLASMA APPARATUS EQUIPPED THEREWITH

BACKGROUND OF THE INVENTION

1. Field of the Invention

This invention relates to an electrostatic chuck for holding an object to be processed, such as a wafer, by means of coulombic energy, and also to a plasma etching apparatus equipped with the electrostatic chuck.

2. Description of the Related Art

An electrostatic chuck holds an object such as a wafer by utilizing the coulombic energy of those negative and positive electric charges on the object and an electrode which are created by applying voltage between the object and the electrode arranged with an insulating layer interposed therebetween.

An electrostatic chuck of this type has been proposed which has an electrostatic holding member interposed between a chuck main body and a wafer. This member is connected to a band-like power supply member covering the side and rear surfaces of the chuck body. If the surface of the chuck body is circular, the electrostatic holding member is formed circular to accord with the chuck body. Each of the members comprises two polyimide insulating member and a conductive member made of copper, etc., and interposed between the insulating members, thus being flexible.

Further, there exists another electrostatic chuck comprising a ceramic chuck body, a conductive member arranged in parallel with a wafer, and a power supply pin perpendicularly inserted in the body from the rear side thereof, for supplying power to the conductive member.

In a plasma etching apparatus, wafers are cooled so as not to be deformed due to high temperature caused by plasma during occurrence thereof. In general, the table is cooled in order to cool a wafer placed thereon. For performing effective heat transfer between the table and wafer, it is necessary to bring the wafer into tight contact with the table. Since they are usually kept in contact by clamping, it is hard to obtain uniform contact. Using an electrostatic chuck is very effective in this case.

The largest problem of the first-mentioned electrostatic chuck is that part of the power supply member extends into the wafer-processing chamber. If this chuck is employed in a plasma etching apparatus, the extended portion of the member will inevitably be damaged by plasma. Even if a tubular crystal cover is provided over the extended portion, plasma may be guided through a clearance formed between the crystal cover and a wafer, damaging the power supply member, thus greatly shortening its life.

On the other hand, in the latter electrostatic chuck, the power supply pin is free from damage due to plasma. However, since the pin is projected upward to mechanically and electrically contact the conductive member, thereby raising the surface of the chuck on which a wafer is to be placed, the electrostatically holding force exerted on the wafer may be reduced.

SUMMARY OF THE INVENTION

It is the object of the invention to provide an electrostatic chuck capable of preventing the electrostatic holding member employed therein and having a high flexibility, from being damaged due to plasma, and hence greatly lengthening the life thereof, and also to provide a plasma etching apparatus equipped with the electrostatic chuck.

The above object is achieved by the following electrostatic chuck and plasma etching apparatus of the invention.

The electrostatic chuck comprises a chuck main body having an upper surface; an electrostatic holding member arranged on the upper surface of the chuck main body, and having a first conductive member and a first insulating member covering the first conductive member; a power supply member arranged through the chuck main body, and having a second conductive member electrically connected to the first conductive member and a second insulating member covering the second conductive member; and means for applying a voltage to the first conductive member via the second conductive member, thereby generating static electricity.

The plasma etching apparatus comprises a chamber having an upper electrode; means for reducing the pressure in the chamber; means for supplying a gas into the chamber; an electrostatic chuck including a lower electrode for cooperating with the upper electrode to create plasma, an electrostatic holding member arranged on an upper surface of the lower electrode and having a first conductive member and a first insulating member covering the first conductive member, and a power supply member arranged through the lower electrode and having a second conductive member electrically connected to the first conductive member and a second insulating member covering the second conductive member; and means for applying a voltage to the first conductive member via the second conductive member thereby generating static electricity.

As described above, in the invention, the electrostatic holding member arranged on the upper surface of the chuck main body is electrically connected to the power supply member extending through the chuck main body, so that the power supply member can reliably supply power to the flexible holding member without being exposed into the chamber.

Further, the depression receiving an end of the power supply member is formed in the upper surface of the chuck main body, which reduces the unevenness of the holding surface of the holding member caused in a state where two members are in contact with each other. Thus, the coulombic force created between the adsorption member is not reduced, and hence a sufficient holding force is obtained. Moreover, to hold an object while controlling the temperature thereof, the unevenness of the holding surface is restrained within a range of e.g. 10 $\mu$m or less, so that a gas for enhancing heat conductivity may not pass freely between the holding member and object.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate a presently preferred embodiment of the invention, and together with the general description given above and the detailed description of the preferred embodiment given below, serve to explain the principles of the invention.

DETAILED DESCRIPTION OF THE PREFERRED EMBODIMENTS

The invention will be explained with reference to the accompanying drawings showing an embodiment thereof.

Figure 1:
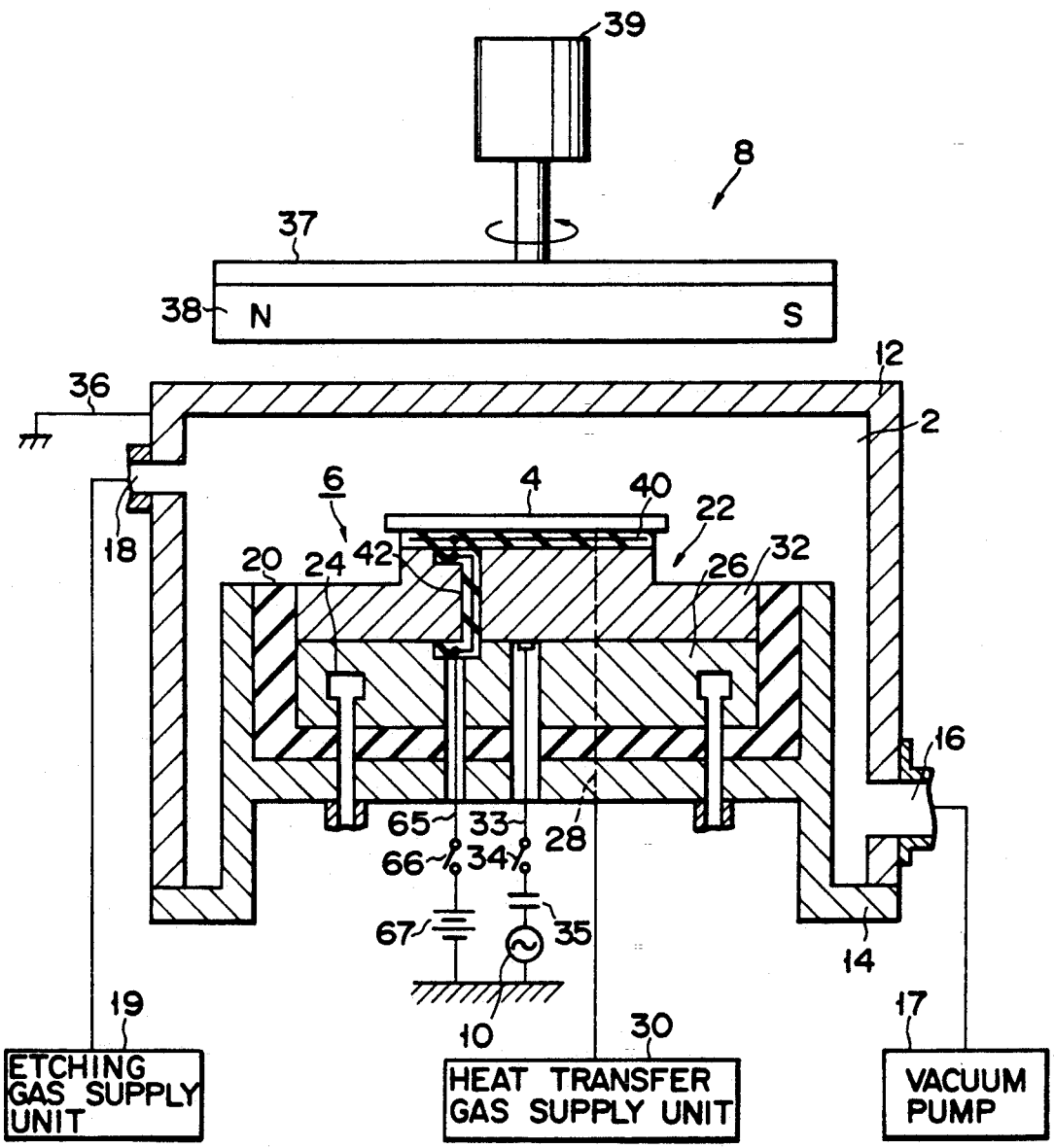
FIG. 1 is a partial sectional view of a plasma etching apparatus according to an embodiment of the invention.

FIG. 1 schematically shows an embodiment in which a plasma etching apparatus is equipped with an electrostatic chuck of the invention. The apparatus comprises a vacuum chamber 2, a table 6 arranged in the chamber 2 for supporting a wafer 4, e.g. a magnet unit 8 for creating a magnetic field in the chamber 2 in a direction perpendicular to the electric field generated, and an RF power source 10 for generating plasma.

The vacuum chamber 2 consists of an upper wall structure 12 and a lower wall structure 14. An exhaust port 16 is formed in the upper wall structure 12 at a lower portion thereof, and connects the vacuum chamber 2 with a vacuum pump 17 which can reduce the pressure in the chamber 2 to about $10^{-6}$ Torr. A gas inlet 18 is formed in the wall structure 12 at an upper portion thereof, and connects the chamber 2 with an etching gas supply unit 19 to supply an etching gas such as chlorine gas into the chamber 2.

The table 6 is located on the lower wall structure 14 with an electrically insulating portion 20 (made of a heat resisting material such as ceramics or polyimide resin) interposed therebetween, and is thus electrically insulated from the wall structure 14. The table 6 has an electrostatic chuck 22 for holding the wafer 4, and a temperature adjusting portion 26 for adjusting the temperature of the wafer 4. The adjusting portion 26 has a fluid passage 24 formed therein for circulating a coolant.

The electrostatic chuck 22 has a main body 32 serving as lower electrode and connected to the RF power source 10 via a lead line 33, an ON/OFF switch 34, and a capacitor 35. The upper wall structure 12 serving as upper electrode is grounded by means of a lead line 36.

That is, these electrodes are arranged to form plane parallel electrodes.

A heat transfer gas supply hole 28 is formed through the lower wall structure 14, electrically insulating portion 20, and table 6, and communicates with a heat transfer gas supply unit 30 for supplying a heat transfer gas to a clearance between the chuck 22 and wafer 4. The heat transfer gas can be selected from $O_2$, $N_2$ or an inactive gas such as He or Ar. The difference in temperature between the wafer 4 and chuck 22 can be maintained within a range of 5° C. or less by supplying a gas under a pressure of e.g. 10 Torr.

The magnet unit 8 has the function of forming an electric field extending in a direction parallel with the surface of an object (e.g. semiconductor wafer) between the electrodes in the vacuum chamber 2, and comprises a supporting member 37 arranged in the horizontal direction, a permanent magnet 38 supported by the supporting member 37, and a motor 39 for rotating the member 37 and magnet 38 in a direction indicated by the arrow in FIG. 1.

In the magnetron plasma etching apparatus constructed as above, the pressure in the vacuum chamber 2 is reduced by means of the vacuum pump 17, and then an etching gas is guided into the chamber 2 from the gas supply unit 19 through the gas inlet 18. Subsequently, a high-frequency voltage of 13.56 MHz is applied between the upper and lower electrodes from the RF power source 10 by turning on the ON/OFF switch 34, and the permanent magnet 38 is driven by the motor 39, thereby forming an electric field between the electrodes. As a result, electrons existing between the electrodes perform cycloid movement, and collide with etching gas molecules. The collided molecules are ionized, thereby causing plasma. The plasma acts upon the wafer 4 placed on the lower electrode 32, performing chemical etching of the wafer.

As described above, since the electric field exists perpendicular to the magnetic field between the electrodes, electrons perform cycloid movement, thereby increasing the number of collisions of electrons against etching gas molecules, the rate at which the gas molecules are ionized is increased, and hence a high etching speed of 1 $\mu$m/min. can be obtained even under a low pressure of $10^{-2}$–$10^{-3}$ Torr. Therefore, in the plasma etching apparatus of the invention, only a short time is required for processing each wafer, and high etching reliability is obtained. Further, the average energy of ions is relatively low, and accordingly wafers are not much damaged.

Next, an embodiment of the electrostatic chuck of the invention will be explained.

Figure 2:
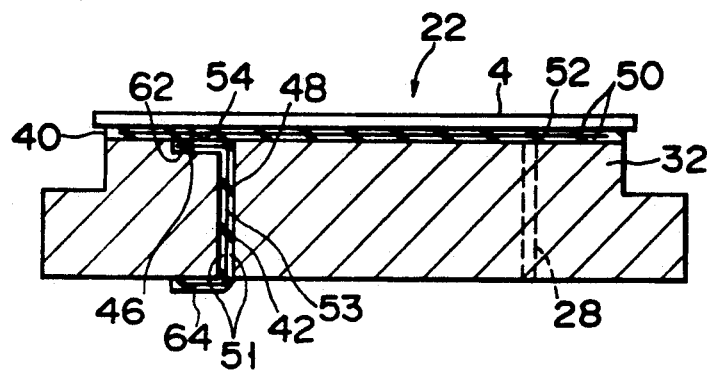
FIG. 2 is a sectional view of an electrostatic chuck provided in the apparatus of FIG. 1.

As is shown in FIG. 2, the electrostatic chuck 22 has the chuck main body 32 serving as lower electrode, a flexible electrostatic holding member 40 arranged on the main body 32, and a power supply member 42 for supplying power to the holding member 40.

Figure 3:
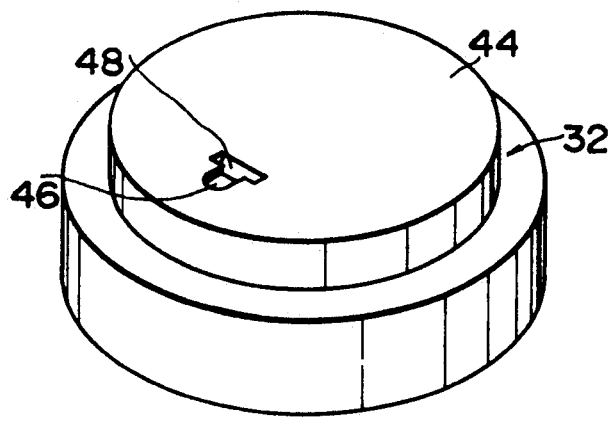
FIG. 3 is a perspective view, showing a main body of the electrostatic chuck of FIG. 2.

As is shown in FIG. 3, the main body 32 is made of e.g. aluminum, and has a depression 46 formed in its circular upper surface 44, and a slit (or rectangular hole) 48 opening in the upper surface 44 in a manner continuous with the depression 46 and extending through the body 32 in the thickness direction thereof. The depression 46 and slit 48 receive the power supply member 42 such that one end of the member 42 does not project over or be buried in the upper surface 44 on which the holding member 40 is placed.

Figure 4:
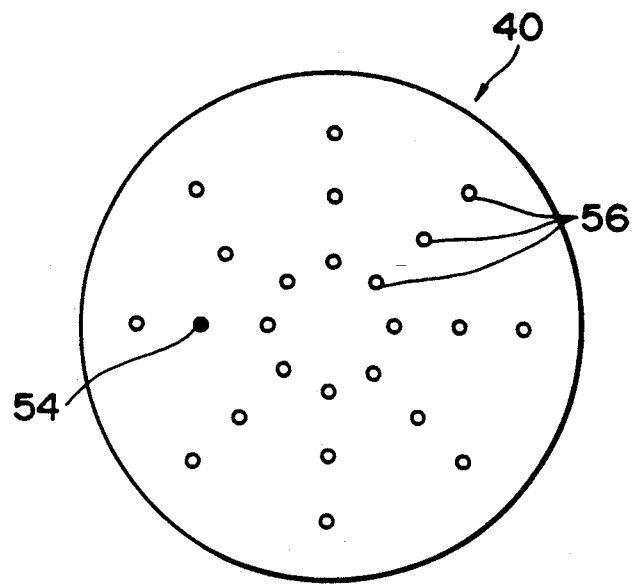
FIG. 4 is a view, showing the bottom of an electrostatic holding member incorporated in the electrostatic chuck.

The electrostatic holding member 40 consists of two insulating polyimide members 50, and a conductive member 52 interposed between the polyimide members 50 and serving as dielectric layer. The holding member 40 is formed circular in accordance with the circular surface 44 of the main body 32. The peripheries of the two polyimide members 50 are welded together and wrap the conductive member 52. The conductive member 52 is made of a conductive material such as copper. In this embodiment, the member 52 has a thickness of about 20 μm, while the polyimide member 50 has a thickness of about 50 μm. The reverse side surface of the adsorption member 40 has a contact 54 formed therein, as is shown in FIG. 4. The contact 54 is formed by partially removing the reverse side polyimide member and exposing a part of the conductive member. Further, the holding member 40 has a plurality of gas inlets 56 extending through the member 40 in the thickness direction thereof. He gas, for example, supplied from the gas supply hole 28 formed in the chuck main body 32 is guided through the gas inlets 56, into a clearance between the holding member 40 and wafer 4, thereby enhancing the heat conductivity therebetween.

Figure 5:
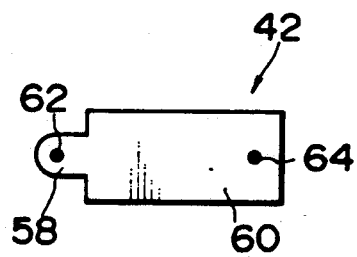
FIG. 5 is a plan view, showing a power supply member employed in the electrostatic chuck before it is folded.
Figure 6:
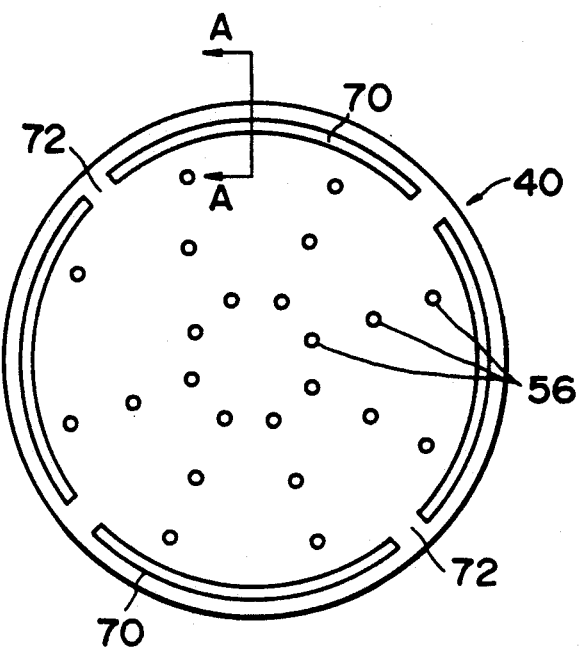
FIG. 6 is a plan view, showing the common bottom of variations of the electrostatic holding member.

Like the holding member 40, the power supply member 42 consists of two polyimide members 51 and a conductive member 53 interposed therebetween. The power supply member 42 need not necessarily be formed of the same material, but of materials having substantially the same coefficient of thermal expansion. As is shown in FIG. 5, the power supply member 42 is a strip comprising a narrow portion 58 with a contact 62 and an enlarged portion 60 with a contact 64 formed at an end thereof remote from the portion 58.

The depression 46 of the chuck main body 32 has a size determined such that it receives the narrow portion 58 of the member 42.

The power supply member 42 is used in a state where the narrow portion 58 is bent perpendicular to the enlarged portion 60. The portion 58 is received in the depression 46, and then the enlarged portion 60 is inserted in the slit 48. Thereafter, that end portion of the enlarged portion 60 on which the contact 64 is provided is bent substantially perpendicular to the slit 48 such that it contacts the reverse side surface of the chuck main body 32.

The contact (first contact) 62 formed at an end of the power supply member 42 is electrically connected to the contact 54 of the electrostatic holding member 40. As is shown in FIG. 1, the contact (second contact) 64 formed at the other end of the member 42 is electrically connected to a lead line 65, which is connected to a direct voltage source 67 via an ON/OFF switch 66. Thus, by turning on the switch 66, a direct voltage of e.g. 2 KV can be applied to the electrostatic holding member 40 via the power supply member 42. The vicinity of the second contact 64 is sealed in an airtight manner by means of an O-ring (not shown).

The operation of the electrostatic chuck will now be explained.

In the chuck 22, a high voltage (approx. 2 KV) is applied between the wafer and the conductive member 52 of the holding member 40, by the direct voltage source 67, thereby causing positive and negative electric charges on the member 52 and wafer 4. By virtue of the coulombic energy of the charges, the wafer 4 is held onto the member 52. The holding force F exerted at this time is theoretically expressed by the following equation:

$$F = (\tfrac{1}{2}) S \epsilon (V/d)^2$$

where symbol S represents the area of the conductive member 52, ε dielectric constant, V voltage, and d the thickness of the insulating film.

The holding force F will be 50 g/cm² and 200-500 g/cm² if the insulating film is formed of polyimide and ceramic, respectively.

In the embodiment, the power supply member 42 covered by the electrostatic holding member 40 and chuck main body 32 is used for obtaining the holding force F. Thus, in a case where the chuck is employed in a plasma etching apparatus, the power supply member 42 is not exposed to the plasma creating space, and hence prevented from being damaged by plasma, resulting in a long life.

In addition, in the embodiment, the temperature of the wafer 4 is controlled (e.g. cooled) by the temperature adjusting portion 26 at the time of plasma etching. To perform such cooling, it is indispensable to fill the clearance formed between the wafer 4 and holding member 40, with a gas for increasing heat conductivity. This is because the holding force F is enough to hold the wafer 4, but insufficient to perform good heat transfer between the holding member 40 and wafer 4. The holding force F is used also to seal a clearance defined between the wafer 4 and holding member 40 so as to enhance the pressure of a gas guided in the clearance.

The materials of the insulating layer and conductive layer employed in the holding member 40 and power supply member 42 are not limited to polyimide and copper, but may be ceramic. It suffices if the materials have substantially the same coefficient of thermal expansion in order that the members 40 and 42, when thermally expanded, may not interrupt electrical connection between their contacts 54 and 62.

In a case where the electrostatic chuck is used in a plasma etching apparatus, when plasma occurs between the upper and lower electrodes, the wafer arranged between the upper and lower electrodes is electrically connected to the upper electrode by the plasma, and thus negative electric charge is accumulated on the wafer. Accordingly, the coulombic energy is increased between the wafer charged with negative electricity and the holding member charged with positive electricity, thereby increasing the holding force of the electrostatic chuck. That is, the wafer is electrostatically chucked only during occurrence of plasma.

FIGS. 6-10 show variations of the electrostatic holding member. The variations of the holding member 40 each have an annular groove 70 formed in the peripheral portion of the upper surface thereof. The groove 70 is formed 10-15 mm inside of the edge of the member. The annular groove 70 is divided into four portions by spaces 72 formed therein at regular intervals. The spaces are provided for performing electrical connection in the peripheral portion. Instead of the groove 70, a plurality of holes may be formed at a pitch of 10-15 mm.

Figure 7:
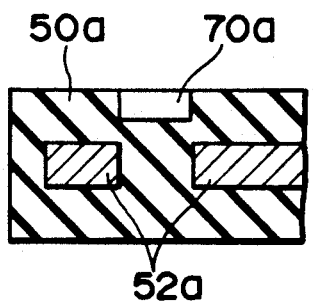
FIG. 7 is a sectional view taken along line A—A of FIG. 6 showing an etching of a peripheral portion of the copper conductive member.

The first variation shown in FIG. 7 has an annular groove 70a formed by etching a peripheral portion of a copper conductive member 52a, thus forming a depressed upper portion in a polyimide member 50a along the etched annular portion.

Figure 8:
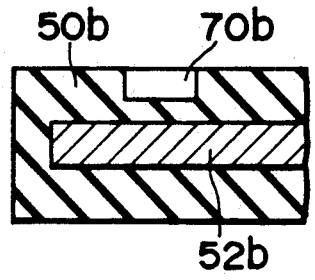
FIG. 8 shows a variation in the etching of a peripheral portion of the copper conductive member.

The second variation shown in FIG. 8 has an annular groove 70b formed by etching an upper peripheral portion of a polyimide member 50b such that the etched annular portion has a rectangular cross section.

Figure 9:
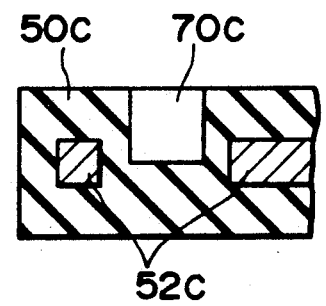
FIG. 9 shows an embodiment similar to FIGS. 7 and 8 with additional treating of the upper portion of the polyimide member in order to create a larger annular groove in an upper portion thereof.

The third variation shown in FIG. 9 has an annular groove 70c formed by etching a peripheral portion of a copper conductive member 52c, then treating an upper portion of a polyimide member 50c to have an annular groove of a rectangular cross section.

Figure 10:
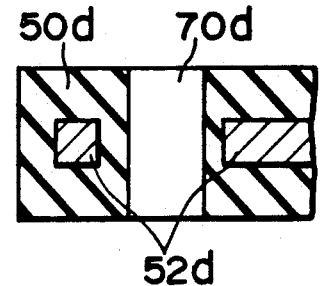
FIG. 10 illustrates a case where the annular hole in the polyimide member is formed as a through hole through the member.

The fourth variation shown in FIG. 10 has an annular through hole 70d formed by etching a peripheral portion of a copper conductive member 52d, then treating a peripheral portion of a polyimide member 50d to have an annular hole of a rectangular cross section.

The gas supplied from the gas inlet 56 is temporarily stored in a groove formed in the peripheral portion of the polyimide member, thereby causing the gas to be diffused at low speed, so that the gas pressure exerting between the wafer 4 and electrostatic holding member 40 is increased and uniformized.

Although the above-described electrostatic chuck is for use mainly in such a plasma etching apparatus, a plasma CVD apparatus, and a sputtering apparatus as require a chuck capable of controlling the temperature of objects to be processed, it also can be applied to other various apparatuses requiring a technique of chucking at the time of processing or transferring objects. Moreover, if the unevenness of the surface of the electrostatic holding member 40 is restrained within a range of ±5 μm or less, an object can be held on the member of a high degree of evenness, and therefore the chuck can be used for exposure.

It is a matter of course that the present invention is not limited to the embodiment disclosed, but may be modified without departing from the scope of the invention.

What is claimed is:

1. An electrostatic chuck comprising:
   a chuck main body;
   an electrostatic adsorption member arranged on an upper surface of the chuck main body, and having a first conductive member and a first insulating member covering the first conductive member;
   a power supply member arranged through the chuck main body, and having a second conductive member electrically connected to the first conductive member, and a second insulating member covering the second conductive member; and
   means for applying a voltage to the first conductive member via the second conductive member, thereby generating static electricity.

2. The electrostatic chuck according to claim 1, wherein the power supply member has a bent end portion, and the chuck main body has a depression receiving the bent end portion such that the bent end portion is in the same level as that of the upper surface of the chuck main body, and a slit opening continuous with the depression, extending through the chuck main body in a thickness direction thereof, and receiving a central of portion the power supply member.

3. The electrostatic chuck according to claim 1, wherein the electrostatic adsorption member has gas inlets formed therethrough.

4. The electrostatic chuck according to claim 3, wherein the chuck main body has a gas supply hole for guiding a heat transfer gas to the gas inlets.

5. The electrostatic chuck according to claim 1, wherein the electrostatic adsorption member has an annular groove formed in a peripheral portion of an upper surface thereof.

6. The electrostatic chuck according to claim 5, wherein the annular groove is formed 10-15 mm inside of the edge of the electrostatic adsorption member.

7. The electrostatic chuck according to claim 1, wherein the insulating member of the electrostatic adsorption member is made of polyimide.

8. The electrostatic chuck according to claim 1, wherein the insulating member of the electrostatic adsorption member is made of ceramic.

9. A plasma apparatus comprising:
   a chamber having a first electrode;
   means for reducing the pressure in the chamber;
   means for supplying a gas into that portion of the chamber in which plasma occurs;
   an electrostatic chuck including a second electrode for cooperating with the first electrode to create plasma, an electrostatic adsorption member arranged on an upper surface of the second electrode and having a first conductive member and a first insulating member covering the first conductive member, and a power supply member arranged through the second electrode and having a second conductive member electrically connected to the first conductive member and a second insulating member covering the second conductive member; and
   means for applying a voltage to the first conductive member via the second conductive member, thereby generating static electricity.

10. The plasma apparatus according to claim 9, wherein the second electrode has a depression receiving an end portion of the power supply member such that the end portion is in the same level as that of the surface of the second electrode, and a slit opening in the upper surface of the second electrode in a manner continuous with the depression, extending through the second electrode in a thickness direction thereof, and receiving a central portion of the second electrode.

11. The plasma apparatus according to claim 9, wherein the electrostatic adsorption member has gas inlets formed therethrough.

12. The plasma apparatus according to claim 11, further comprising means for guiding a heat transfer gas to the gas inlets.

13. The plasma apparatus according to claim 9, wherein the electrostatic adsorption member has an annular groove formed in a peripheral portion of an upper surface thereof.

14. The plasma apparatus according to claim 13, wherein the annular groove is formed 10-15 mm inside of the edge of the electrostatic adsorption member.

15. The plasma apparatus according to claim 9, wherein the insulating member of the electrostatic adsorption member is made of polyimide.

16. The plasma apparatus according to claim 9, wherein the insulating member of the electrostatic adsorption member is made of ceramic.

* * * * *